(12) United States Patent
Zheng

(10) Patent No.: US 11,251,410 B2
(45) Date of Patent: Feb. 15, 2022

(54) FLEXIBLE DISPLAY SUBSTRATE AND METHOD FOR MANUFACTURING THE SAME

(71) Applicant: WUHAN CHINA STAR OPTOELECTRONICS SEMICONDUCTOR DISPLAY TECHNOLOGY CO., LTD., Wuhan (CN)

(72) Inventor: Ying Zheng, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 295 days.

(21) Appl. No.: 16/481,527

(22) PCT Filed: Apr. 24, 2019

(86) PCT No.: PCT/CN2019/083991
§ 371 (c)(1),
(2) Date: Jul. 29, 2019

(87) PCT Pub. No.: WO2020/124914
PCT Pub. Date: Jun. 25, 2020

(65) Prior Publication Data
US 2021/0336234 A1  Oct. 28, 2021

(30) Foreign Application Priority Data
Dec. 19, 2018  (CN) .......................... 201811566929.5

(51) Int. Cl.
H01L 51/56 (2006.01)
H01L 27/32 (2006.01)
H01L 51/00 (2006.01)

(52) U.S. Cl.
CPC .......... H01L 51/56 (2013.01); H01L 27/3258 (2013.01); H01L 51/0097 (2013.01); *H01L 2227/323* (2013.01); *H01L 2251/5338* (2013.01)

(58) Field of Classification Search
None
See application file for complete search history.

(56) References Cited

U.S. PATENT DOCUMENTS 10,833,106 B2 * 11/2020 Ke .................. H01L 51/0097
2015/0102298 A1 * 4/2015 Namkung .......... H01L 51/0097
257/40

(Continued)

FOREIGN PATENT DOCUMENTS

CN  104733498 A  6/2015
CN  107170758 A  9/2017

(Continued)

*Primary Examiner* — J. E. Schoenholtz

(57) ABSTRACT

The present invention provides a flexible display substrate and a method for manufacturing the same. The flexible display substrate has a bending area and a display area. The flexible display substrate includes a first organic layer, multiple first grooves formed on one surface of the first organic layer, an intermediate layer covered on the other surface of the first organic layer, a second organic layer covered on the intermediate layer, multiple second grooves formed on one surface of the second organic layer away from the first grooves, a buffer layer covered on the one surface of the second organic layer, and a gate line covered on the buffer layer. The present invention can reduce stresses of the bending area, improve the damage resistance of the flexible display substrate during bending, and avoid cracks in an inorganic layer and breakage in a metal line.

11 Claims, 4 Drawing Sheets

(56) References Cited

U.S. PATENT DOCUMENTS

| | | |
|---|---|---|
| 2015/0179728 A1 | 6/2015 | Kwon et al. |
| 2018/0088390 A1* | 3/2018 | Ohara ................. H01L 27/3276 |
| 2019/0273213 A1 | 9/2019 | Niu et al. |

FOREIGN PATENT DOCUMENTS

| | | |
|---|---|---|
| CN | 108010921 A | 5/2018 |
| CN | 108461630 A | 8/2018 |

* cited by examiner

FLEXIBLE DISPLAY SUBSTRATE AND METHOD FOR MANUFACTURING THE SAME

BACKGROUND OF THE INVENTION

1. Field of the Invention

The present invention relates to a flexible display technology field, and more particularly to a flexible display substrate and a method for manufacturing the same.

2. Description of the Prior Art

With the continuous development of science and technology, display technology has been constantly updated. In the future, the demand for display devices is more convenient, fashionable and suitable for a wider range of environments. Flexible devices made of flexible substrates are expected to become the mainstream device of next generation optoelectronic devices. The flexible displays, such as a flexible organic light-emitting diode (FOLED), have the advantages of self-luminescent display, fast response, high brightness and wide viewing angle. It can be curled and folded. Therefore, comparing with a traditional hard screen display, the flexible display has the advantages of light weight, small volume, convenient carrying and wide application prospects.

A flexible display panel is often bent in an outer foot binding area in order to achieve smaller boundaries and greater screen proportions. However, when pad bending, there are a large number of inorganic layers and metal wires on a flexible substrate, if the bending radius decreases, a large amount of stress concentration will occur, which will lead to the cracking of an inorganic film layer of the display panel and the breaking of the metal wires, and further lead to the failure of smooth transmission of electrical signals in the display panel. For all film layers in the pad bending area, the thickness of the flexible substrate accounts for the majority of all film thickness. This will lead to a sharp increase in bending stress and increase the probability of fracture of inorganic layer and metal wire above.

3. Technical Problem

To solve the above problems, the present invention provides a flexible display substrate, an outer foot binding area of which is patterned. Namely, a bending area of the flexible display substrate disposes multiple grooves, thereby reducing stresses of the bending area, improving the damage resistance of the flexible display substrate during bending, and avoiding cracks in an inorganic layer and breakage in a metal line.

BRIEF SUMMARY OF THE INVENTION

Technical Solutions

The technical scheme of solving the above problems is to provide a flexible display substrate, having a bending area and a display area. The flexible display substrate includes: a first organic layer; multiple first grooves, being formed on one surface of the first organic layer and corresponding to the bending area; an intermediate layer, being covered on the other surface of the first organic layer; a second organic layer, being covered on the intermediate layer; multiple second grooves, being formed on one surface of the second organic layer away from the first grooves; each of two sides of each second groove forming one protrusion; the second grooves being corresponding to the bending area; a buffer layer, being covered on the one surface of the second organic layer; wherein, in the bending area, the buffer layer being covered on the protrusion; and a gate line, being covered on the buffer layer and being corresponding to the bending area.

In one embodiment of the present invention, in the display area, the flexible display substrate further includes: an active layer, being disposed on the buffer layer and having a source area and a drain area; a grid insulating layer, being covered on the active layer and the buffer layer; a grid electrode, being disposed on the grid insulating layer; an interlayer dielectric layer, being covered on the grid electrode and the grid insulating layer; contact holes, passing through the interlayer dielectric layer unto the active layer; wherein one contact hole being corresponding to the source area, and the other contact hole being corresponding to the drain area; a source electrode and a drain electrode, being disposed on the interlayer dielectric layer; wherein the source electrode passing through one contact hole to be connected to the source area, and the drain electrode passing through the other contact hole to be connected to the drain hole; a flat layer, being covered on the source electrode, the drain electrode and the interlayer dielectric layer; an organic light emitting layer, being disposed on the flat layer; and a packaging layer, being disposed on the organic light emitting layer.

In one embodiment of the present invention, in the bending area, the flexible display substrate further includes a metal protect layer covered on the gate line.

In one embodiment of the present invention, viscosities of materials of the first organic layer and the second organic layer are 3000 cps-5000 cps, and thicknesses of the first organic layer and the second organic layer are 6 μm-10 μm.

In one embodiment of the present invention, the thickness of the first organic layer is less than or equal to that of the second organic layer.

In one embodiment of the present invention, depths of the first grooves and the second grooves are 1 μm-4 μm, and the first grooves are corresponding to the second grooves.

In one embodiment of the present invention, the intermediate layer is made of one of silicon oxide, silicon nitride, the composite of silicon oxide and silicon nitride, and alumina; and a thickness of the intermediate layer is 450 nm-550 nm.

The present invention further provides a method for manufacturing a flexible display substrate, including the following steps: providing a carrier substrate; forming an inorganic layer on the carrier substrate; in a bending area, etching a plurality of grooves passing through the inorganic layer; and in a displaying area, removing the inorganic layer; forming a first organic layer on the carrier substrate, and the first organic layer filling and covering all the grooves; forming an intermediate layer on the first organic layer; forming a second organic layer on an intermediate layer; in the bending area etching a plurality of second grooves from one surface of the second organic layer to an inside of the second organic layer; and each of two sides of each second groove forming one protrusion; forming a buffer layer on the second organic layer; in the bending layer, the buffer layer being covered on the protrusion; forming a gate line on the buffer layer to be corresponding to the bending area; and removing the carrier substrate and the inorganic layer on the first organic layer, and forming multiple first grooves on the first organic layer; wherein the first grooves are corresponding to areas between the grooves.

In one embodiment of the present invention, between the step of forming the buffer layer and the step of removing the carrier substrate and the inorganic layer on the first organic layer, the method further includes the following steps: forming an active layer on the buffer layer, wherein the active layer has a source area and a drain area; forming a grid insulating layer on the active layer and the buffer layer; forming a grid electrode on the grid insulating layer; forming an interlayer dielectric layer on the grid electrode and the grid insulating layer; forming contact holes to pass through the interlayer dielectric layer unto the active layer; wherein one contact hole is corresponding to the source area, and the other contact hole is corresponding to the drain area; forming a source electrode and a drain electrode on the interlayer dielectric layer; the source electrode being connected to the source area through one contact hole, and the drain electrode being connected to the drain hole through the other contact hole; wherein the step of forming the gate line is synchronized with the step of forming the source electrode and the drain electrode; forming a flat layer on the source electrode, the drain electrode and the interlayer dielectric layer; forming an organic light emitting layer on the flat layer; and forming a packaging layer on the organic light emitting layer.

In one embodiment of the present invention, the step of forming the flat layer includes: in the bending area, forming a metal protect layer on the gate line.

Beneficial Effect

The beneficial effects of the present invention are as follows. The present invention provides a flexible display substrate and a method for manufacturing the same. A first organic layer and a second organic layer are patterned to form multiple grooves, which can effectively reduce stresses of a bending area when a grid electrode, a source electrode, a drain electrode and a gate line on the flexible substrate are bent. The present invention can further improve the damage resistance of the flexible display substrate during bending, avoid cracks in an inorganic layer and breakage in a metal line, effectively improve the flexure resistance of the flexible display substrate, and improve the reliability and life of flexible display device.

BRIEF DESCRIPTION OF THE DRAWINGS

For more clearly illustrating the technical scheme in the embodiment of the present invention, the following text will briefly introduce the accompanying drawings used in the embodiment. It is obvious that the accompanying drawings in the following description are only some embodiments of the present invention. For the technical personnel of the field, other drawings can also be obtained from these drawings without paying creative work.

Figure 1:
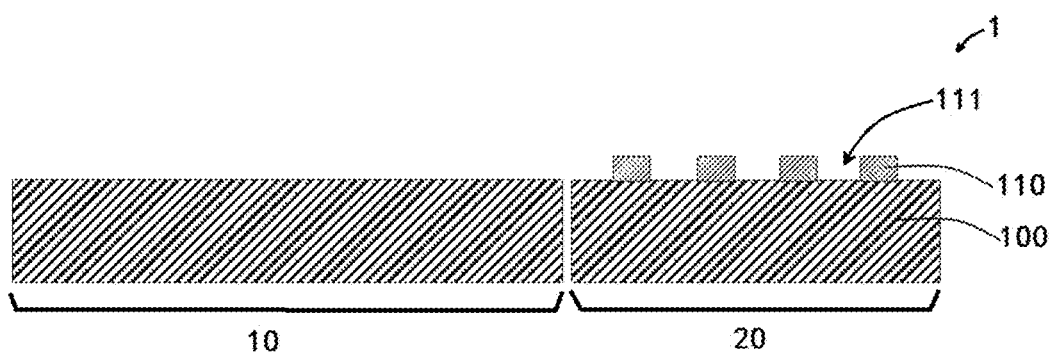
FIG. 1 is a structural view of a flexible display substrate when forming an inorganic layer according to one embodiment of the present invention.

REFERENCE NUMERALS IN THE ABOVE DRAWINGS 1 flexible display substrate
10 display area
20 bending area
100 carrier substrate
110 inorganic layer
210$a$, 210$b$ first organic layer
300 intermediate layer
220$a$-220$b$ second organic layer
400$a$, 400$b$ buffer layer
500 active layer
600 grid insulating layer
700 grid electrode
800 interlayer dielectric layer
900 gate line
910 source electrode
920 drain electrode
930 contact hole
1000 flat layer
1000$b$ metal protect layer
2000 organic light emitting layer
3000 packaging layer
111 groove
211 first groove
221 second groove
222 protrusion
501 source area
502 drain area

DETAILED DESCRIPTION OF THE PREFERRED EMBODIMENTS

The following text will describe embodiments of the present invention in detailed. The embodiments are shown in the accompanying drawings, in which the same or similar signs represent the same or similar elements or elements with the same or similar functions from beginning to end. The following embodiments described with reference to the accompanying drawings are illustrative and are intended only to explain the present invention and are not understood as limitations to the invention.

The following description of every embodiment with reference to the accompanying drawings is used to exemplify a specific embodiment, which may be carried out in the present invention. Directional terms mentioned in the present invention, such as "upper", "lower", "front", "back", "left", "right", "inside", "outside", "side" etc., are only used with reference to the orientation of the accompanying drawings. Therefore, the used directional terms are intended to illustrate, but not to limit the present invention.

Figure 4:
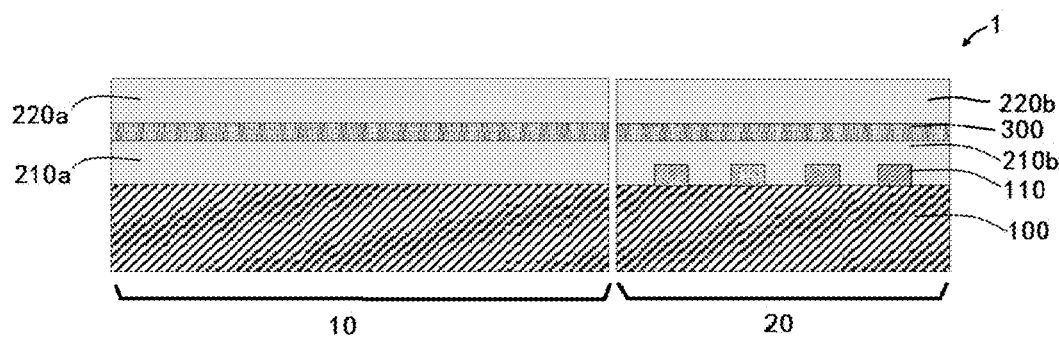
FIG. 4 is a structural view of the flexible display substrate when forming a second organic layer according to one embodiment of the present invention.
Figure 10:
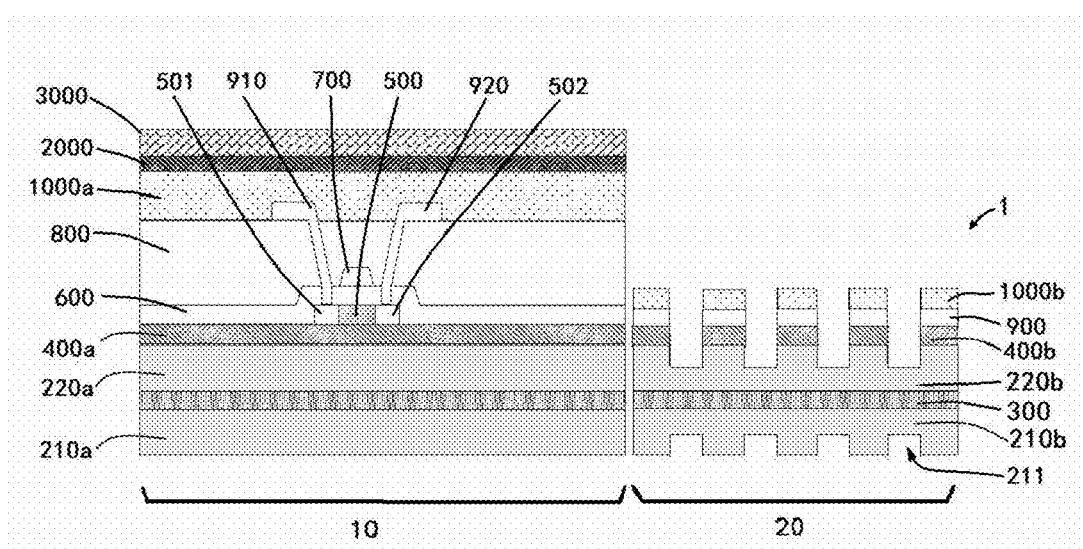
FIG. 10 is a structural view of the flexible display substrate according to one embodiment of the present invention.

Please refer to FIGS. 4 and 10, in one embodiment, a flexible display substrate 1 of the present invention disposes a bending area 20 and a display area 10, wherein the bending area 20 is also referred to as an outer foot binding area of the flexible display substrate 1. The flexible display substrate 1 includes a first organic layer 210a, 210b, an intermediate layer 300, a second organic layer 220a, 220b, and a buffer layer 400a, 400b from bottom to top. The intermediate layer 300 is covered on the first organic layer 210a, 210b. The second organic layer 220a, 220b is covered on the intermediate layer 300. The buffer layer 400a, 400b is covered on the 220a, 220b.

Viscosities of materials of the first organic layer 210a, 210b and the second organic layer 220a, 220b are 3000-5000 cps. Thicknesses of the first organic layer 210a, 210b and the second organic layer 220a, 220b are 6 μm-10 μm. In the embodiment, the thickness of the first organic layer 210a, 210b is less than or equal to that of the second organic layer 220a, 220b.

The intermediate layer 300 is made of one of silicon oxide, silicon nitride, the composite of silicon oxide and silicon nitride, and alumina. A thickness of the intermediate layer 300 is 450 nm-550 nm, preferably 500 nm.

The buffer layer 400a, 400b is made of one of silicon oxide, silicon nitride, the composite of silicon oxide and silicon nitride, and alumina. A thickness of the intermediate layer 300 is 450 nm-550 nm, preferably 500 nm.

Figure 5:
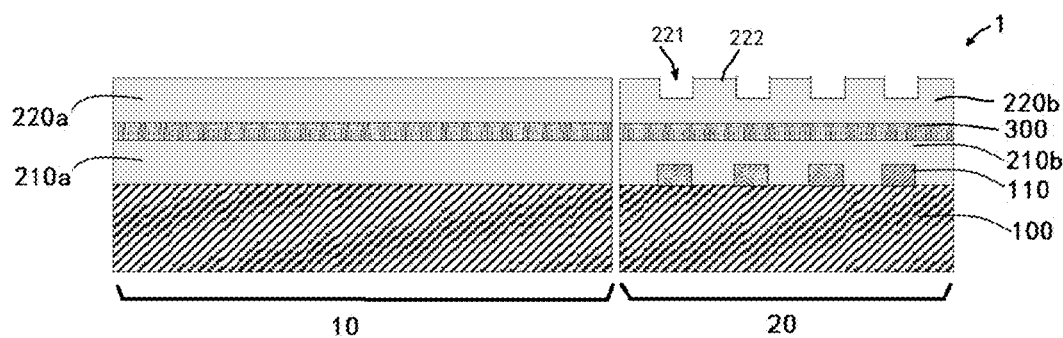
FIG. 5 is a structural view of the flexible display substrate when forming second grooves according to one embodiment of the present invention.

Please refer to FIGS. 5 and 10, in the bending area 20, the flexible display substrate 1 further includes multiple first grooves 211, multiple second grooves 221, a gate line 900, and a metal protect layer 1000b. Wherein, the first grooves 211 are formed on one surface of the first organic layer 210b. Namely, the first grooves 211 extend from one surface of the first organic layer 210b to the inside of the first organic layer 210b. The first grooves 211 are corresponding to the bending area 20. The intermediate layer 300 is covered on the other surface of the first organic layer 210b. The second grooves 221 are also corresponding to the bending area 20 and are formed on one surface of the second organic layer 220b away from the first grooves 211. Namely, the second grooves 221 extend from one surface of the second organic layer 220b away from the first grooves 211 to the inside of the second organic layer 220b. The first grooves 211 are corresponding to the second grooves 221. The second organic layer 220b further disposes multiple protrusions 222, which are arranged on two sides of each second groove 221. In the bending area 20, the buffer layer 400b is covered on the protrusions 222. The gate line 900 is covered on the buffer layer 400b and is corresponding to the bending area 20. The metal protect layer 1000b is covered on the gate line 900. In the embodiment, the gate line 900 may be a source line and a drain line. The depths of the first grooves 211 and the second grooves 221 are 1 μm-4 μm.

Referring to FIGS. 7 to 10, in the display area 10, the flexible display substrate 1 further includes an active layer 500, a grid insulating layer 600, a grid electrode 700, an interlayer dielectric layer 800, a source electrode 910, a drain electrode 920, contact holes 930, a flat layer 1000a, an organic light emitting layer 2000, and a packaging layer 3000. Wherein, the active layer 500 is disposed on the buffer layer 400a. The active layer 500 has a source area 501 and a drain area 502. The grid insulating layer 600 is covered on the active layer 500 and the buffer layer 400a. The grid electrode 700 is disposed on the grid insulating layer 600. The interlayer dielectric layer 800 is covered on the grid electrode 700 and the grid insulating layer 600. The contact holes 930 pass through the interlayer dielectric layer 800 unto the active layer 500. One of the contact holes 930 is corresponding to the source area 501, and the other of the contact holes 930 is corresponding to the drain area 502. The source electrode 910 and the drain electrode 920 are disposed on the interlayer dielectric layer 800. The source electrode 910 passes through the corresponding contact hole 930 to be connected to the source area 501. The drain electrode 920 passes through the other contact hole 930 to be connected to the drain area 502. The flat layer 1000a is covered on the source electrode 910, the drain electrode 920 and the interlayer dielectric layer 800. The organic light emitting layer 2000 is disposed on the flat layer 1000a. The packaging layer 3000 is disposed on the organic light emitting layer 2000.

The present invention further provides a method for manufacturing the flexible display substrate 1, including the following steps.

Referring to FIG. 1, a carrier substrate 100 is provided. An inorganic layer 110 is formed on the carrier substrate 100. In the bending area 20, a plurality of grooves 111 are etched through the inorganic layer 110. In the display area 10, the inorganic layer 110 is removed. Specifically, the inorganic layer 110 is formed on the carrier substrate 100 by a method of vapor deposition. The inorganic layer 110 is made of silicon oxide or silicon nitride, and the thickness is 1 μm-4 μm. Then, in the bending area 20, the grooves 111 are etched on the inorganic layer 110. The number and density of the grooves 111 are determined according to actual needs. Moreover, the inorganic layer 110 on the display area 10 is removed by etching. The shape of the grooves 111 may be rectangular or stepped, and of course other shapes.

Figure 2:
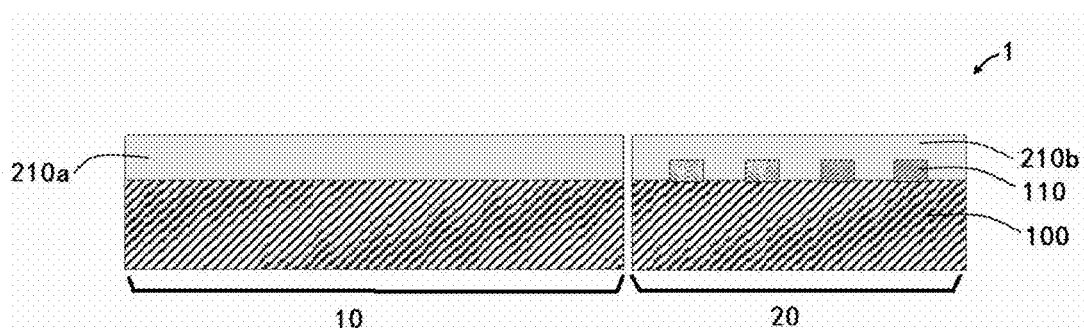
FIG. 2 is a structural view of the flexible display substrate when forming a first organic layer according to one embodiment of the present invention.

Referring to FIG. 2, a first organic layer 210a, 210b is formed on the carrier substrate 110 and the first organic layer 210b can fill and cover all the grooves 111. At this time, the first organic layer 210b forms multiple first grooves 211 (seen in FIG. 10) corresponding to the bending area 20 on one surface thereof. In the embodiment, the first organic layer 210a, 210b is made of polyimide, and its viscosity is 3000-5000 cps. In the actual production process, the polyimide is covered on the carrier substrate 100, and the first organic layer 210b can fill and cover all the grooves 111. The thickness of the first organic layer 210a, 210b made of the polyimide is 6 μm-10 μm.

Figure 3:
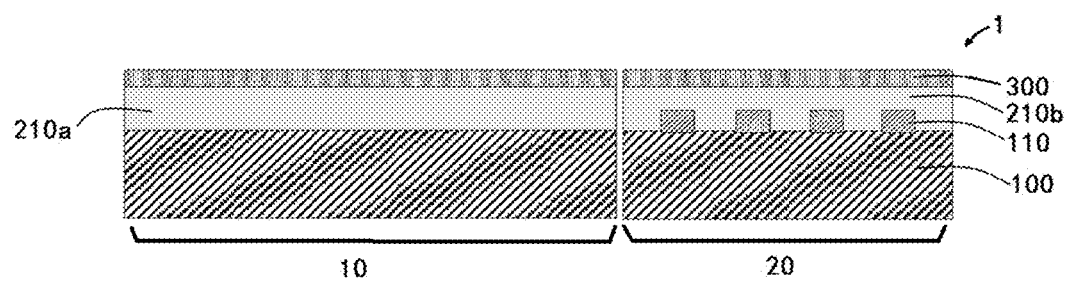
FIG. 3 is a structural view of the flexible display substrate when forming an intermediate layer according to one embodiment of the present invention.

Referring to FIG. 3, an intermediate layer 300 is formed on the other surface of the first organic layer 210a, 210b. The intermediate layer 300 is made of one of silicon oxide, silicon nitride, the composite of silicon oxide and silicon nitride, and alumina. In the actual production process, the intermediate layer 300 is formed on the first organic layer 210a, 210b by vapor deposition, and a thickness of the intermediate layer 300 is 450 nm-550 nm, preferably 500 nm.

Referring to FIGS. 4 and 5, a second organic layer 220a, 220b is formed on the intermediate layer 300. In the bending area 20, multiple second grooves 221 are etched on the second organic layer 220b and extend from one surface of the second organic layer 220b to the inside of the second organic layer 220b. Meanwhile, each of two sides of each second groove 221 forms one protrusion 222. In the embodiment, the second organic layer 220a, 220b is made of polyimide, and its viscosity is 3000-5000 cps. In the actual production process, the polyimide is covered on the intermediate layer 300, and the thickness of the second organic layer 220a, 220b made of the polyimide is 6 μm-10 μm. Then, in the bending area 20, the second grooves 221 are formed on the second organic layer 220b by etching. The depth of the second groove 221 is 1 μm-4 μm. There forms the corresponding protrusion 222 on two sides of each second grooves 221. In the embodiment, the thickness of the first organic layer 210a, 210b is less than or equal to that of the second organic layer 220a, 220b. For example, if the thickness of the first organic layer 210a, 210b is 6 μm, the thickness of the second organic layer 220a, 220b is 6 μm or greater than 6 μm. If the thickness of the first organic layer 210a and 210b is 10 μm, the thickness of the second organic layer 220a and 220b can only be 10 μm.

Figure 6:
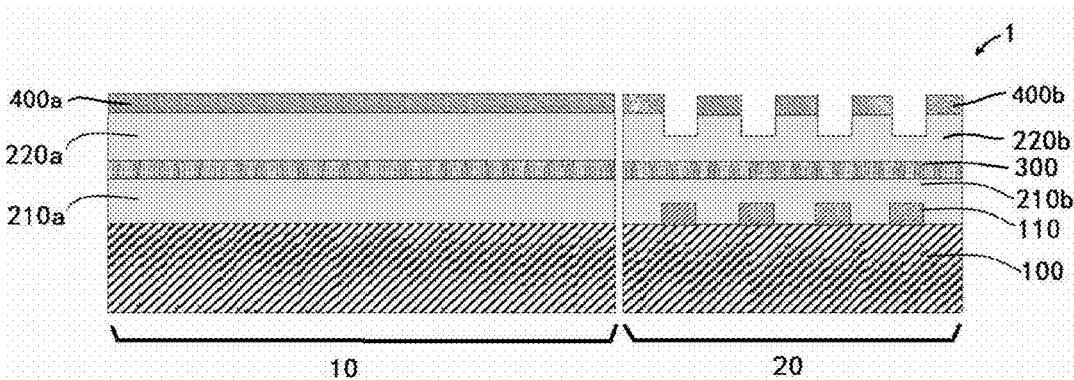
FIG. 6 is a structural view of the flexible display substrate when forming a buffer layer according to one embodiment of the present invention.

Referring to FIG. 6, a buffer layer 400a, 400b is formed on the second organic layer 220a, 220b. In the bending area 20, the buffer layer 400a, 400b is covered on the protrusions 222. The buffer layer 400a, 400b is made of one of silicon oxide, silicon nitride, the composite of silicon oxide and silicon nitride, and alumina. A thickness of the intermediate layer 300 is 450 nm-550 nm, preferably 500 nm. In the actual production process, the buffer layer 400a, 400b is formed on the second organic layer 220a, 220b by vapor deposition. In the bending area 20, the buffer layer 400b is only deposited on the protrusions 222 and not in the second grooves 221.

Figure 7:
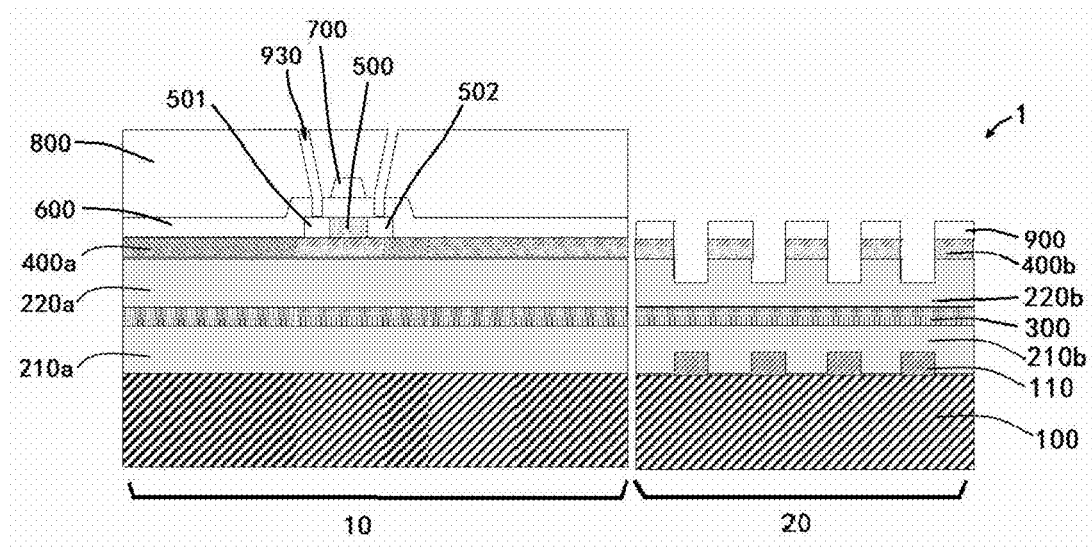
FIG. 7 is a structural view of the flexible display substrate when forming contact holes according to one embodiment of the present invention.

Referring to FIG. 7, an active layer 500 is formed on the buffer layer 400a. The active layer 500 has a source area 501 and a drain area 502. In the actual production process, the deposited amorphous silicon layer is transformed into polycrystalline silicon by excimer laser technology, and the active layer 500 is formed by photoresist coating, exposure, development, etching and peeling. It should be noted that the specific manufacturing process of the active layer 500 has not been improved in the present invention, and the active layer 500 is formed by the corresponding common technology according to the actual needs. So the manufacturing process of the active layer 500 is not described in detail here.

A grid insulating layer 600 is formed on the active layer 500 and the buffer layer 400a. In the actual production process, by vapor deposition, a silicon oxide layer is deposited on the active layer 500 and the buffer layer 400a as the grid insulating layer 600.

A grid electrode 700 is formed on the grid insulating layer 600. In the actual production process, a grid metal layer is formed on the grid insulating layer 600 by sputtering and evaporation, and then the grid metal layer is patterned to form the grid electrode 700.

An interlayer dielectric layer 800 is formed on the grid electrode 700 and the grid insulating layer 600. In the actual production process, the interlayer dielectric layer 800 is deposited on the grid electrode 700 and the grid insulating layer 600 by chemical vapor deposition.

Contacting holes are formed and pass through the interlayer dielectric layer 800 unto the active layer 500 for making the corresponding area of the active layer 500 exposed. One of the contact holes 930 is corresponding to the source area 501, and the other of the contact holes 930 is corresponding to the drain area 502.

Figure 8:
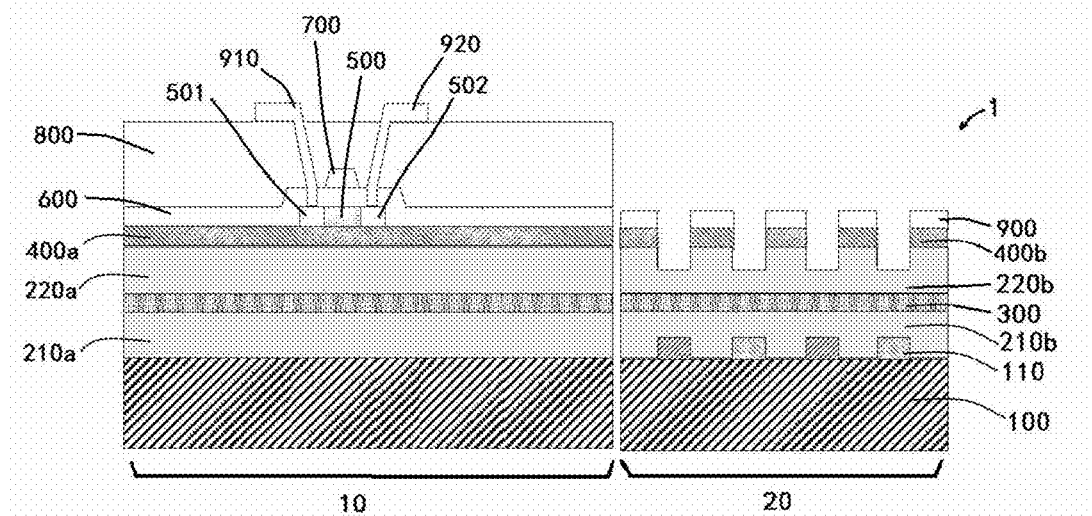
FIG. 8 is a structural view of the flexible display substrate when forming a source electrode, a drain electrode and a gate line according to one embodiment of the present invention.

Referring to FIG. 8, a source electrode 910 and a drain electrode 920 are formed on the interlayer dielectric layer 800, and a gate line 900 is formed on the buffer layer 400b and is corresponding to the bending area 20. The source electrode 910 passes through the corresponding contact hole 930 to be connected to the source area 501. The drain electrode 920 passes through the other contact hole 930 to be connected to the drain area 502. In the actual production process, by sputtering and evaporation, the source electrode 910 and the drain electrode 920 are formed in the display area 10, and the gate line 900 is formed in the bending area 20. Specifically, a conductive film can be formed by the same film forming process, and then the conductive film can be patterned once, thereby forming the source electrode 910, the drain electrode 920 and the pattern of the gate line 900.

Figure 9:
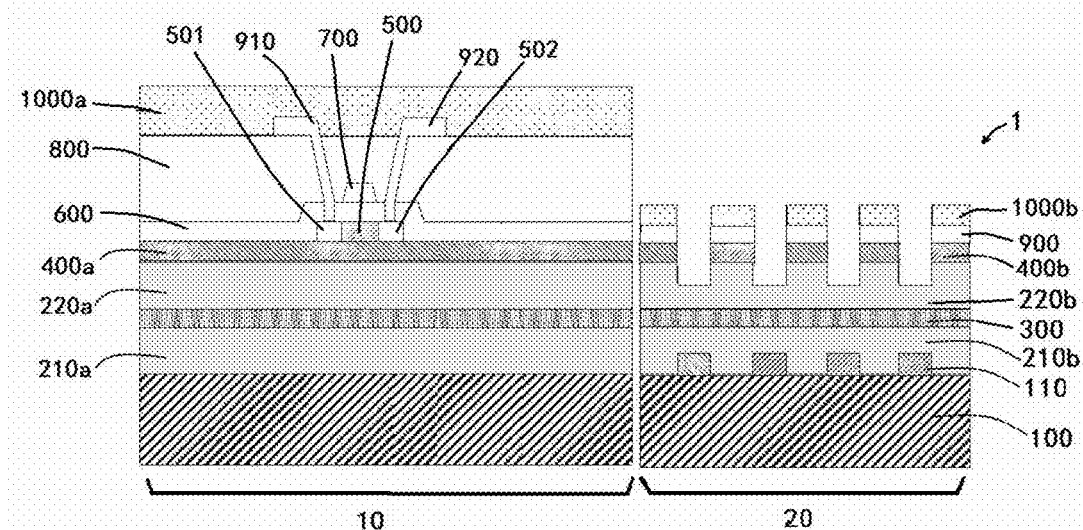
FIG. 9 is a structural view of the flexible display substrate when forming a flat layer and a metal protect layer according to one embodiment of the present invention.

Referring to FIG. 9, a flat layer 1000a is formed on the source electrode 910, the drain electrode 920 and the interlayer dielectric layer 800, and a metal protect layer 1000b is formed on the gate line 900. The flat layer 1000a covers the source electrode 910, the drain electrode 920 and the gate line 900. The flat layer 1000a helps to reduce or eliminate the height difference caused by each layer on the flexible display substrate 1, and provides a relatively flat surface for subsequent device layers.

An organic light emitting layer 2000 is formed on the flat layer 1000a.

A packaging layer 3000 is formed on the organic light emitting layer 2000.

Referring to FIG. 10, the carrier substrate 100 and the inorganic layer 110 are removed from the first organic layer 210a, 210b. Meanwhile, the first grooves 211 are formed on the first organic layer 210b and are corresponding to areas between the grooves 111. In the actual production process, the carrier substrate 100 and the inorganic layer 110 are stripped from the first organic layer 210a, 210b by a laser peeling method, so the flexible display substrate 1 of the present invention can be obtained.

The above description is only the preferred embodiments of the present invention, and should not be used to limit the present invention. Any modification, equivalent replacement and improvement made within the spirit and principles of the invention shall be included in the scope of protection of the invention.

What is claimed is:

1. A flexible display substrate, having a bending area and a display area, wherein the flexible display substrate including:
    a first organic layer;
    multiple first grooves, being formed on one surface of the first organic layer and corresponding to the bending area;
    an intermediate layer, being covered on an other surface of the first organic layer;
    a second organic layer, being covered on the intermediate layer;
    multiple second grooves, being formed on one surface of the second organic layer away from the first grooves; each of two sides of each second groove forming one protrusion; the second grooves being corresponding to the bending area;
    a buffer layer, being covered on the one surface of the second organic layer; wherein, in the bending area, the buffer layer being covered on the protrusion; and
    a gate line, being covered on the buffer layer and being corresponding to the bending area.

2. The flexible display substrate as claimed in claim 1, wherein in the display area, the flexible display substrate further includes:
    an active layer, being disposed on the buffer layer and having a source area and a drain area;
    a grid insulating layer, being covered on the active layer and the buffer layer;
    a grid electrode, being disposed on the grid insulating layer;
    an interlayer dielectric layer, being covered on the grid electrode and the grid insulating layer;
    contact holes, passing through the interlayer dielectric layer unto the active layer; wherein one contact hole being corresponding to the source area, and an other contact hole being corresponding to the drain area;

a source electrode and a drain electrode, being disposed on the interlayer dielectric layer; wherein the source electrode passing through the one contact hole to be connected to the source area, and the drain electrode passing through the other contact hole to be connected to the drain hole;

a flat layer, being covered on the source electrode, the drain electrode and the interlayer dielectric layer;

an organic light emitting layer, being disposed on the flat layer; and a packaging layer, being disposed on the organic light emitting layer.

3. The flexible display substrate as claimed in claim 1, wherein in the bending area, the flexible display substrate further includes a metal protect layer covered on the gate line.

4. The flexible display substrate as claimed in claim 1, wherein viscosities of materials of the first organic layer and the second organic layer are 3000 cps-5000 cps, and thicknesses of the first organic layer and the second organic layer are 6 μm-10 μm.

5. The flexible display substrate as claimed in claim 1, wherein the thickness of the first organic layer is less than or equal to that of the second organic layer.

6. The flexible display substrate as claimed in claim 1, wherein depths of the multiple first grooves and the multiple second grooves are 1 μm-4 μm, and the multiple first grooves are corresponding to the multiple second grooves.

7. The flexible display substrate as claimed in claim 1, wherein the intermediate layer is made of one of silicon oxide, silicon nitride, the composite of silicon oxide and silicon nitride, and alumina; and a thickness of the intermediate layer is 450 nm-550 nm.

8. A method for manufacturing a flexible display substrate, including the following steps:

providing a carrier substrate;

forming an inorganic layer on the carrier substrate; in a bending area, etching a plurality of grooves passing through the inorganic layer; and in a displaying area, removing the inorganic layer;

forming a first organic layer on the carrier substrate, and the first organic layer filling and covering all of the plurality of grooves passing through the inorganic layer;

forming an intermediate layer on the first organic layer;

forming a second organic layer on an intermediate layer; in the bending area etching a plurality of second grooves from one surface of the second organic layer to an interior of the second organic layer; and each of two sides of each second groove forming one protrusion;

forming a buffer layer on the second organic layer; in the bending layer, the buffer layer being covered on the protrusion;

forming a gate line on the buffer layer to be corresponding to the bending area; and removing the carrier substrate and the inorganic layer on the first organic layer, and forming multiple first grooves on the first organic layer; wherein the multiple first grooves are corresponding to areas between the plurality of grooves passing through the inorganic layer.

9. The method for manufacturing the flexible display substrate as claimed in claim 8, wherein between the step of forming the buffer layer and the step of removing the carrier substrate and the inorganic layer on the first organic layer, the method further includes the following steps:

forming an active layer on the buffer layer, wherein the active layer has a source area and a drain area;

forming a grid insulating layer on the active layer and the buffer layer;

forming a grid electrode on the grid insulating layer;

forming an interlayer dielectric layer on the grid electrode and the grid insulating layer;

forming contact holes to pass through the interlayer dielectric layer unto the active layer; wherein one contact hole is corresponding to the source area, and an other contact hole is corresponding to the drain area;

forming a source electrode and a drain electrode on the interlayer dielectric layer; the source electrode being connected to the source area through the one contact hole, and the drain electrode being connected to the drain hole through the other contact hole;

wherein the step of forming the gate line is synchronized with the step of forming the source electrode and the drain electrode on the interlayer dielectric layer;

forming a flat layer on the source electrode, the drain electrode and the interlayer dielectric layer;

forming an organic light emitting layer on the flat layer; and forming a packaging layer on the organic light emitting layer.

10. The method for manufacturing the flexible display substrate as claimed in claim 9, wherein the step of forming the flat layer on the source electrode includes:

in the bending area, forming a metal protect layer on the gate line.

11. A flexible display panel, comprising the flexible display substrate as claimed in claim 1.

* * * * *